United States Patent [19]

Korsh et al.

[11] 4,412,310
[45] Oct. 25, 1983

[54] EPROM CELL WITH REDUCED PROGRAMMING VOLTAGE AND METHOD OF FABRICATION

[75] Inventors: George J. Korsh, Redwood City; Mark A. Holler, Milpitas; George Perlegos, Fremont; Paolo Gargini, Palo Alto, all of Calif.

[73] Assignee: Intel Corporation, Santa Clara, Calif.

[21] Appl. No.: 196,838

[22] Filed: Oct. 14, 1980

[51] Int. Cl.³ .......................................... G11C 11/40
[52] U.S. Cl. .................................. 365/185; 365/218; 365/104
[58] Field of Search ............... 365/174, 103, 104, 185, 365/218

[56] References Cited

U.S. PATENT DOCUMENTS

| 4,004,159 | 1/1977 | Rai et al. | 365/185 |
| 4,016,588 | 4/1977 | Ohya et al. | 365/185 |
| 4,371,955 | 2/1983 | Sasaki | 365/185 |

Primary Examiner—Terrell W. Fears
Attorney, Agent, or Firm—Blakely, Sokoloff, Taylor & Zafman

[57] ABSTRACT

An improved floating gate MOS EPROM cell which is programmable at a lower potential (12 volts) than prior art devices which often require 25 volts. The oxide thickness between the floating gate and overlying control gate is thicker at the edges of the floating gate than in the central portion. The thicker oxide at the edges prevents uncontrolled DC erasing. This allows a thinner oxide to be used in the central portion and provides the increased capacitance coupling needed for programming at a lower potential.

10 Claims, 10 Drawing Figures

4,412,310

EPROM CELL WITH REDUCED PROGRAMMING VOLTAGE AND METHOD OF FABRICATION

BACKGROUND OF THE INVENTION

1. Field of the Invention

The invention relates to the field of metal-oxide-semiconductors (MOS), electrically programmable read-only memory (EPROM) cells employing floating gates.

2. Prior Art

Read-only memories (ROMs) are often used, particularly in the computer industry, for storing programs, constants and the like. Frequently, for development purposes and also when limited numbers are required, electrically programmable read-only memories (EPROMs) are employed. EPROMs permit the user to insert data into memory, rather than having the memory manufacturer insert the data during fabrication of the memory. One class of these memories is fabricated with MOS technology and employs cells (with floating gates) which are erased by exposing the memory to radiation such as ultraviolet light. Commercial versions of these memories are sold under Part Nos. 2708 and 2716, in addition to other numbers.

The initial erasable EPROM memories with floating gate cells employed p-channel devices which were charged through avalanche injection such as the device described in U.S. Pat. No. 3,660,819. In order to charge a floating gate in this device, a relatively high programming voltage is needed to avalanche a junction and provide a source of high energy electrons which are injected onto the floating gate.

As the prior art went to denser and faster structures, n-channel MOS EPROM cells were employed rather than p-channel. One such device is shown in U.S. Pat. No. 3,996,657. In addition to the reversal of the conductivity types of the various regions, these n-channel devices commonly employ two gates, the usual floating gate and an additional gate located above the floating gate, used as a control gate. This control gate is used to charge the floating gate and for device selection. Charge is normally injected into the floating gate from the channel region, rather than from the source or drain region as in the case of the previously described p-channel floating gate devices. This is sometimes referred to as channel injection as opposed to the earlier avalanche injection. Improved versions of this n-channel floating gate memory device are described in U.S. Pat. Nos. 4,142,926 and 4,114,255.

Typically, these prior art n-channel EPROM cells require 25 volts for programming. This is a somewhat higher voltage than is normally available for integrated circuit use. Thus, there is some inconvenience associated with programming these devices because of this higher programming voltage. Moreover, it is more difficult to handle these higher voltages in the memory.

As will be seen, the present invention provides a floating gate device somewhat similar to that of the prior art, however, with the distinct advantage of being programmable with a voltage of approximately 12 volts. This is a substantial improvement since 12 volt power supplies are commonly available for integrated circuit use. Also this lower voltage can be decoded more readily on a memory chip.

SUMMARY OF THE INVENTION

An improvement in an MOS electrically programmable MOS memory cell is disclosed. The cell, as in the prior art, includes a pair of spaced-apart regions in a substrate which define a channel region and a floating gate insulated from and disposed above the channel region. A control gate for programming the cell and for accessing the cell, is disposed above the floating gate and insulated from the floating gate. With the improvement of the present invention, the insulation between the floating gate and the control gate is thicker at the edges of the control gate than in the central portion of the control gate. In this manner, a thinner insulation may be used between the floating gate and the control gate without having uncontrolled removal (erasing) of charge from the floating gate. The thinner insulation permits the programming of the cell at a lower potential.

BRIEF DESCRIPTION OF THE DRAWINGS

FIG. 4 is a cross-sectional elevation view of a substrate which includes an oxide layer and a silicon nitride layer.

FIG. 5 illustrates the substrate of FIG. 4 after the etching of the silicon nitride layer and during an ion implantation step.

FIG. 6 illustrates the substrate of FIG. 5 after a field oxide has been grown on the substrate.

FIG. 7 illustrates the substrate of FIG. 6 after a photomasking step and after an ion implantation step.

FIG. 8 illustrates the substrate of FIG. 7 after a polysilicon layer, silicon dioxide layer and silicon nitride layer have been formed over the substrate.

FIG. 9 illustrates the substrate of FIG. 8 after a masking and etching step.

FIG. 10 illustrates the substrate of FIG. 9 after an additional oxide has been grown on the substrate.

DETAILED DESCRIPTION OF THE INVENTION

Figure 1:
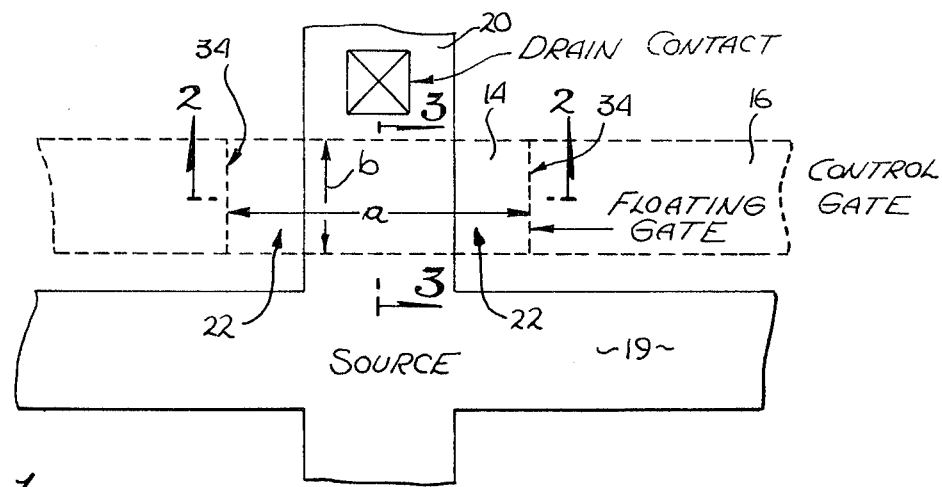
FIG. 1 is a plan view showing the memory cell of the present invention.

An electrically programmable read-only memory (EPROM) cell is described. The cell is fabricated with MOS technology as will be described. In the following description, numerous specific details, such as specific dopants, thicknesses of layers, etc. are set forth in order to provide a thorough understanding of the present invention. However, it will be obvious to one skilled in the art that the present invention may be practiced without these specific details. In other instances, well-known structures and processing steps have not been described in detail in order not to obscure the present invention in unnecessary detail.

One of the primary objects of the present invention is to provide a floating gate EPROM cell which can be programmed at a lower potential than prior art cells of this type. As mentioned, with prior art cells, approximately 25 volts is required for programming as compared to 12 volts for the invented cell.

One way to program at a lower potential is to provide more coupling between the control gate (gate 16 of FIGS. 1,2 and 3) and the substrate 12. More coupling can be obtain by using thinner oxides between the control gate 16 and floating gate 14 and also between the floating gate and substrate. A problem encountered, however, in using a thinner oxide between the control gate and floating gate is that a cell with a charged gate slowly erases during normal use. Specifically, assume that the floating gate 14 is charged. If a thin oxide is present between the control gate and the floating gate, the charge from the floating gate is slowly removed through the control gate, effectively destroying the data stored in the cell. The removal of the charge in this manner is somewhat known in the prior art and is sometimes referred to as "DC erase". This phenomena is used for an electrically programmable and electrically erasable memory cell (E²PROM cell); see U.S. Pat. Nos. 4,119,995 and 4,009,196.

In attempting to produce an EPROM cell which would program at a lower potential, it was discovered that the DC erase characteristics were largely controlled by the oxide thickness at the edge of the floating gate as opposed to the central portion of the floating gate. While the reason for this is not entirely clear, it may be that the curvature at the edges of the floating gate provides an enhanced electric field which promotes the erasing and/or that the oxide is of poorer quality at the edges of the gate.

The present invention provides a memory device which can be programmed at a lower potential since the oxide regions 34 at the edges of the floating gate 14 are thicker than the oxide layer 32 located in the central portion of the gate.

Figure 2:
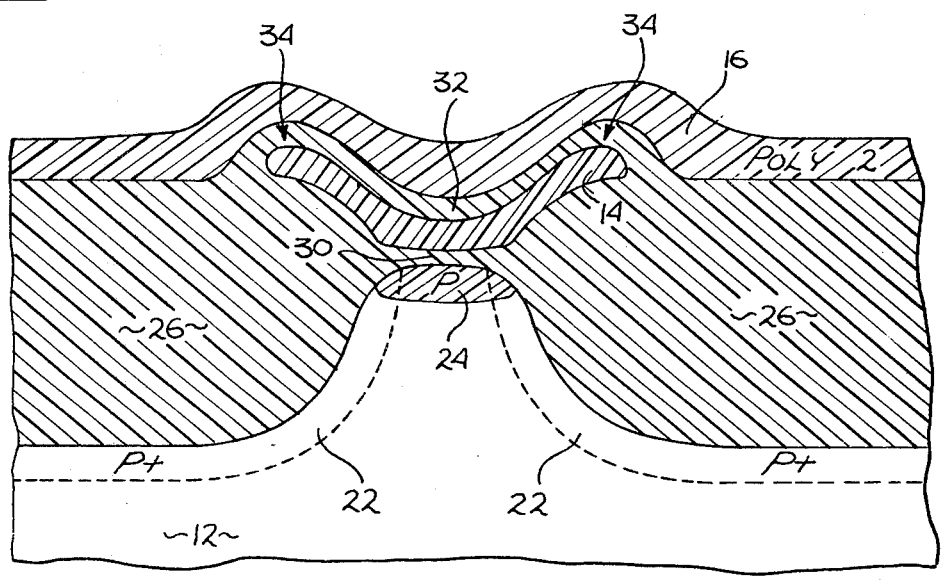
FIG. 2 is a cross-sectional elevation view of the memory of the present invention taken through section line 2—2 of FIG. 1.
Figure 3:
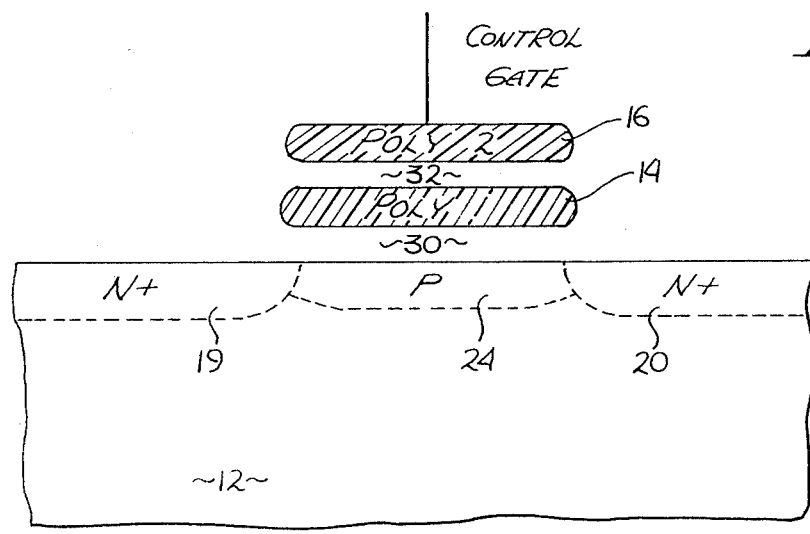
FIG. 3 is a cross-sectional elevation view of the memory of the present invention taken through section line 3—3 of FIG. 1.

Referring now to FIGS. 1 through 3, the EPROM cell of the present invention includes (best seen in FIG. 3) a pair of spaced-apart n-type source/drain regions 19 and 20 disposed in a p-type substrate 12. The channel defined between these n-type regions includes a p-type region 24. Disposed above the channel and completely surrounded by an oxide (silicon dioxide) is the floating gate 14. The control gate 16 which consists of an elongated polysilicon line (best seen in FIG. 1) is insulated from the floating gate and enables programming and control functions as in prior art devices. The invented cell requires a substrate area of approximately 5.5×5.5 mils, for the presently preferred embodiment.

As best seen in FIG. 2, the edges of the channel include heavily doped p-type regions 22. These regions enhance the programming of the device and are generally fabricated as described in U.S. Pat. No. 4,114,255.

When the device of FIGS. 2 and 3 is fabricated in an array, the drain region of each device is coupled through a drain contact to an overlying metal line not illustrated. (The drain contact, however, is shown in FIG. 1). The source region 19 for an array of cells is an elongated doped region and forms a common source region for a plurality of EPROM cells. The dimension "b" of FIG. 1 of the floating gate 14 and the overlying control gate 16 are formed in alignment with one another from a first and second layer of polysilicon as shall be described in greater detail. The etching process used to form these gates in alignment with one another is described in U.S. Pat. No. 4,142,926.

Figure 4:
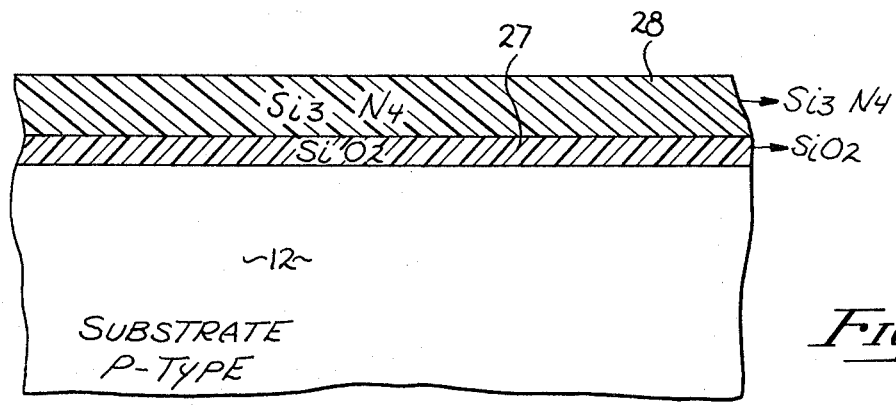
FIGS. 4–10 illustrate the invented process for fabricating the memory of FIGS. 1-3.
Figure 5:
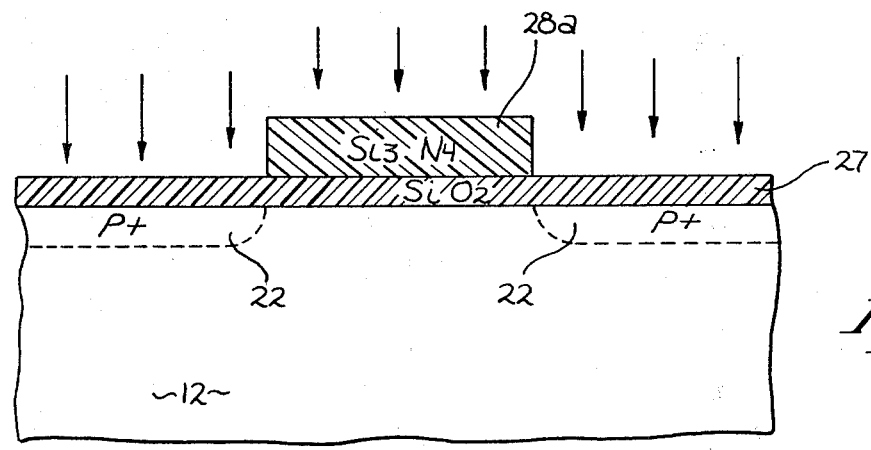

Referring now to FIG. 4, for the presently preferred fabrication of the invented cell, a p-type monocrystalline silicon substrate 12 doped to a level of approximately 50 ohm cm is employed. After ordinary cleaning steps, a silicon dioxide layer 27 of approximately 375 Å is grown on the substrate. Following this, a silicon nitride layer 28 of approximately 1000 Å is formed over the oxide layer 27.

Figure 6:
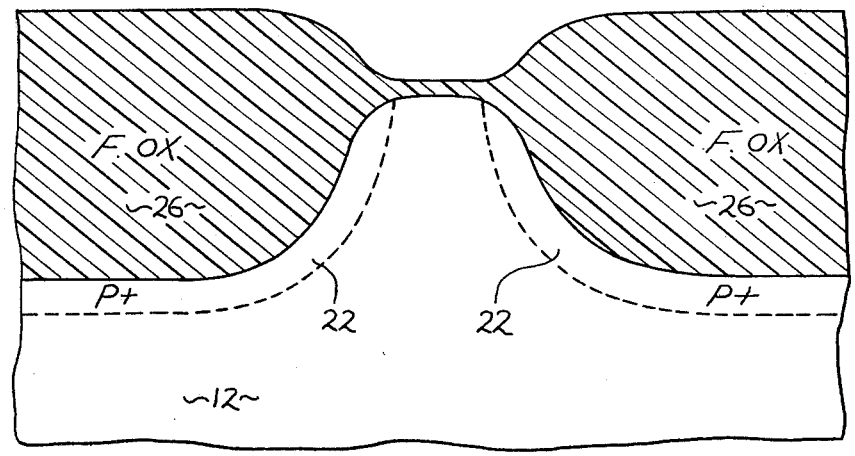

The silicon nitride layer 28 through ordinary photolithographic techniques is etched to form member 28a. Then the substrate is subjected to an ion implantation step to form the channel stop regions 22. In the presently preferred embodiment, a boron implant is used to a concentration level of $1\times10^{13}$ cm$^{-2}$. The substrate is then subjected to a high temperature step of approximately 920° C. to form the field oxide layer 26 shown in FIG. 6. The field oxide is approximately 8000 Å thick for the described embodiment.

It will be appreciated that during the formation of the channel stop regions and field oxide layer 26 described above, that other channel stop regions and field oxide layers are formed in other areas of the substrate, for example, in the peripheral circuits.

Figure 7:
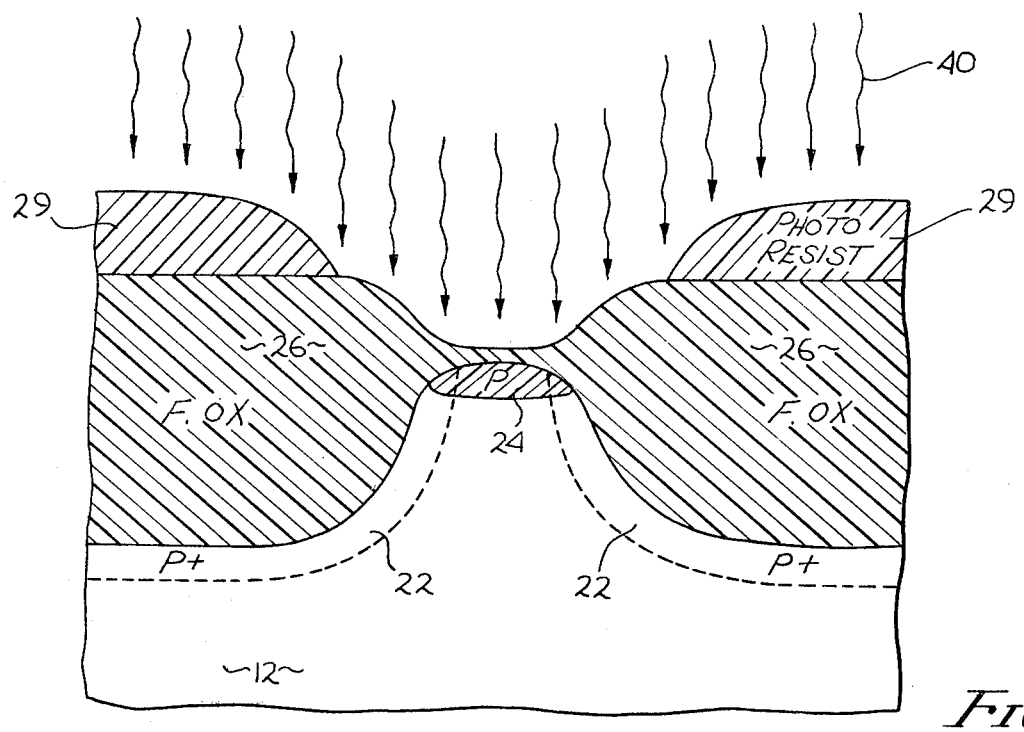
Figure 8:
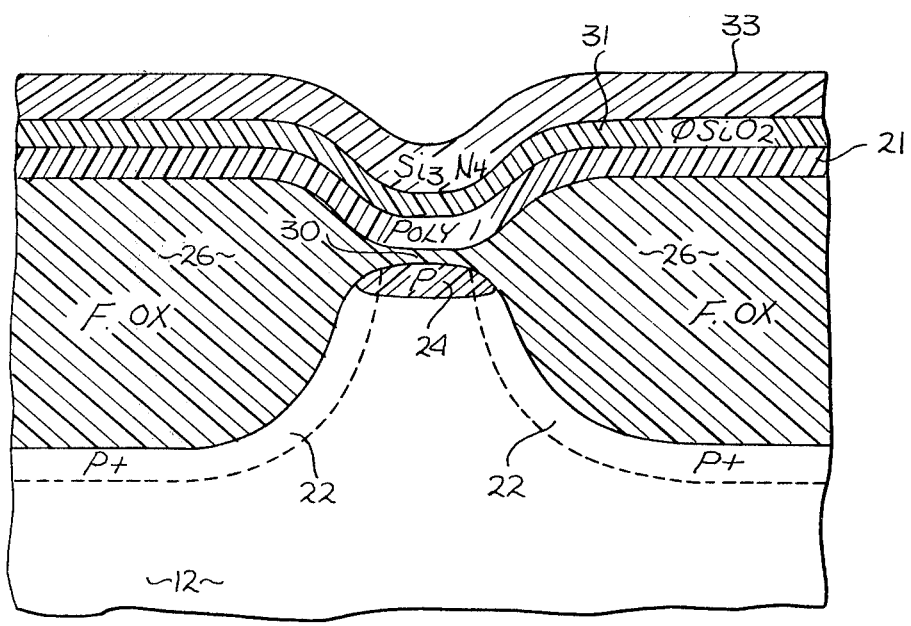

Now, a photoresist layer 29 is formed over the substrate and through use of ordinary masking and etching steps, the photoresist is removed above the channel regions of the memory cells, for example, above region 24 of FIG. 7.

The substrate is then subjected to an ion implantation step as indicated by lines 40 to increase the doping in the channel regions, thus forming region 24. In the presently preferred embodiment, boron is implanted to a level of $4\times10^{12}$ cm$^{-2}$. This provides doping in the channel to a level of $10^{17}$/cm$^3$, thereby increasing the programming efficiency of the cell since programming or the number of electrons injected into the oxide is directly related to the doping in the channel. Thinner oxides are used in the cell to compensate for increasing threshold voltages of the cell resulting from the higher doping and to provide a threshold voltage compatible with the n-channel MOS devices used in the peripheral circuits. The resultant cell has a threshold voltage of between 5 and 6 volts when the floating gate is charged, and a threshold voltage of approximately 1.5 volts when the floating gate is uncharged.

In the presently preferred embodiment, following the implantation step of FIG. 7, the oxide above the region 24 is removed and a new gate oxide is grown. The new HCl grow gate oxide layer 30 is formed at a relatively low temperature (1000° C.) to a thickness of approximately 250°. Following this, a layer of polysilicon 21 of approximately 2000 Å thick is formed over the substrate, followed by the formation of a silicon dioxide layer 31 of 400–500 Å thick and silicon nitride layer 33.

Figure 9:
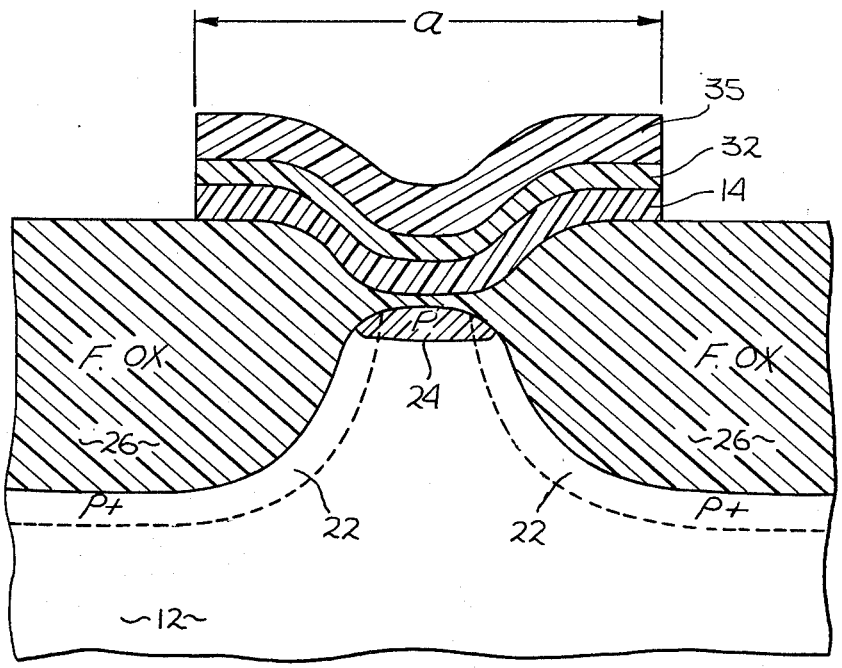

Now, through ordinary masking and etching steps as shown in FIG. 9, the dimension "a" (also shown in FIG. 1) of the floating gate 14 is defined. This is done by first etching the silicon nitride layer 33 to form the member 35 and by etching the oxide layer 31 to form the oxide layer 32 of FIG. 9.

Figure 10:
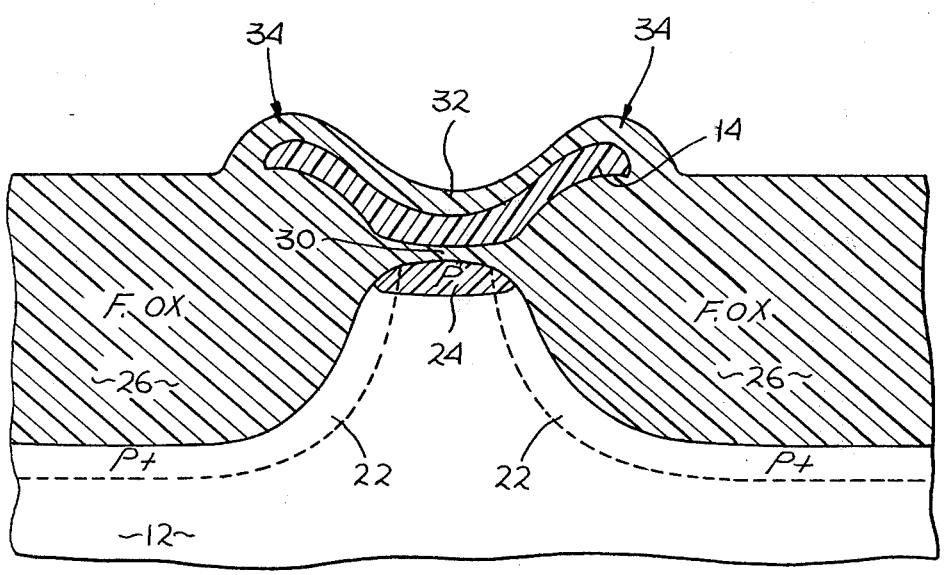

Next, the substrate is subjected to a temperature of approximately 1000° C. (HCl atmosphere) to grow an oxide layer. The silicon nitride member 35 of FIG. 9 prevents the growth of oxide directly over layer 32. However, at the exposed edges of the floating gate 14 and the edges of layer 32, an oxide does grow. The resulting structure is shown in FIG. 10 with the silicon nitride member 35 removed. The oxide layer 32 directly above the central portion of the floating gate 14 is approximately 400–500 A thick, Importantly, however, the oxide regions 34 at the edges of the floating gate 14 are approximately 700 Å thick. It is this thicker oxide at the edges of the floating gate which prevents the DC erase and permits the use of the thinner (400–500 Å)

oxide layer 32 in the central portion of the floating gate 14.

Following this, a second layer of polysilicon is formed over the substrate as shown in FIG. 10 and this second layer is patterned to define the control gate 16 shown in FIG. 2. The "b" dimension shown in FIG. 1 of the floating gate is defined with the patterning of the second level of polysilicon. The source/drain regions are now formed by ion implanting arsenic.

Finally, commonly employed "rear end" steps are used to complete the device including formation of protective layers, contacts and overlying metal layers.

Referring again to FIG. 2, because of the thinner gate oxide layer 30 and thinner oxide layer 32 more capacitance coupling exists between the control gate 16 and substrate (particularly in the channel region of the cell). This greater coupling enables programming at a lower potential when compared to prior art devices. Because of the thicker oxide regions at the edges of the floating gate (oxide regions 34) uncontrolled erasing does not occur. By way of example, in some prior art devices the equivalent layer to layer 32 is approximately 1500Å (compared to 400–500 Å in the invented structure).

Thus, an EPROM cell has been described along with its method of fabrication, which cell can be programmed at a lower potential than prior art devices.

We claim:

1. In an electrically programmable, MOS memory cell, having a pair of spaced-apart regions in a substrate which define a channel region, a floating gate member insulated from and disposed above said channel region, and a control gate member insulated from and disposed above said floating gate member, an improvement in said cell wherein:
    the insulation between said floating gate member and said control gate member is thicker at the edges of said floating gate member than in the central portion of said floating gate member;
    wherein a thinner insulation may be used between said floating gate member and said control gate member without having uncontrolled removal of charge from said floating gate member, thereby permitting the programming of said cell at a lower potential.

2. The improvement defined by claim 1 wherein said insulation comprises silicon dioxide and wherein said silicon dioxide is approximately 400–500 Å thick in said central portion.

3. The improvement defined by claim 2 wherein said silicon dioxide is approximately 700 Å at said edges of said floating gate member.

4. An electrically programmable MOS memory cell fabricated on a substrate of a first conductivity type comprising:
    a pair of spaced-apart regions of the second conductivity type disposed in said substrate, said spaced-apart regions defining a channel region;
    a first insulative layer disposed above said channel region;
    a floating gate member disposed above said channel region and insulated from said channel region by said first insulative layer;
    a second insulative layer disposed above said floating gate member;
    a control gate member disposed above said channel region and insulated from said floating gate member by said second insulative layer, said second insulative layer being thicker at edges of said floating gate member than in the central portion of said floating gate member;
    whereby said thicker insulative layer at said edges of said floating gate member reduces uncontrolled removal of charge from said floating gate member.

5. The memory cell defined by claim 4 wherein said first conductivity type is p-type and second conductivity type is n-type.

6. The memory cell defined by claim 5 wherein said channel region is doped to a higher concentration level with a p-type dopant than said substrate.

7. The memory cell defined by claim 5 wherein said first and second insulative layers comprise silicon dioxide layers and wherein said gate members comprise polysilicon.

8. The memory cell defined by claim 7 wherein said second insulative layer is approximately 400–500 Å thick at said central portion of said floating gate member.

9. The memory cell defined by claim 8 wherein said second insulative layer is approximately 700 Å thick at said edges of said floating gate member.

10. The memory cell defined by claim 9 wherein said first insulative layer is approximately 250 Å thick.

* * * * *